United States Patent
Bergantz

(10) Patent No.: US 11,610,796 B2
(45) Date of Patent: *Mar. 21, 2023

(54) EQUIPMENT FRONT END MODULES INCLUDING MULTIPLE ALIGNERS, ASSEMBLIES, AND METHODS

(71) Applicant: APPLIED MATERIALS, INC., Santa Clara, CA (US)

(72) Inventor: Nicholas Michael Bergantz, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/396,873

(22) Filed: Aug. 9, 2021

(65) Prior Publication Data

US 2021/0366753 A1   Nov. 25, 2021

Related U.S. Application Data

(63) Continuation of application No. 16/849,969, filed on Apr. 15, 2020, now Pat. No. 11,139,190.

(Continued)

(51) Int. Cl.
*H01L 21/677* (2006.01)
*H01L 21/68* (2006.01)
(Continued)

(52) U.S. Cl.
CPC ........ *H01L 21/67745* (2013.01); *B65G 47/90* (2013.01); *H01L 21/67766* (2013.01); *H01L 21/68* (2013.01); *H01L 21/68707* (2013.01)

(58) Field of Classification Search
CPC ......... H01L 21/67766; H01L 21/68707; H01L 21/67742
See application file for complete search history.

(56) References Cited

U.S. PATENT DOCUMENTS

2009/0082895 A1   3/2009  Barker et al.
2016/0167229 A1*  6/2016  Hosek ............... B25J 18/04
                                                74/490.06
(Continued)

FOREIGN PATENT DOCUMENTS

CN    1443132 A    9/2003
CN  101542708 A    9/2009
(Continued)

OTHER PUBLICATIONS

PCT Application No. PCT/US2020/029252, International Search Report and Written Opinion dated Aug. 14, 2020, 12 pages.

(Continued)

*Primary Examiner* — Gerald McClain
(74) *Attorney, Agent, or Firm* — Lowenstein Sandler LLP

(57) ABSTRACT

A system includes an equipment front end module chamber, alignment pedestals housed within the equipment front end module chamber, and a load/unload robot at least partially housed within the equipment front end module chamber. The alignment pedestals include a first alignment pedestal having a first support surface and a second alignment pedestal having a second support surface, and the first support surface has a vertical offset and an overlap region having at least a partial overlap relative to the second support surface. The load/unload robot includes an arm, and vertically arranged blades attached to the arm. The vertically arranged blades include an upper blade configured to transfer a first substrate to the first alignment pedestal and a lower blade configured to transfer a second substrate to the second alignment pedestal.

20 Claims, 9 Drawing Sheets

Related U.S. Application Data

(60) Provisional application No. 62/837,271, filed on Apr. 23, 2019.

(51) Int. Cl.
  *B65G 47/90* (2006.01)
  *H01L 21/687* (2006.01)

(56) References Cited

U.S. PATENT DOCUMENTS

| | | | |
|---|---|---|---|
| 2017/0178933 A1 | | 6/2017 | Ferrara et al. |
| 2018/0012789 A1* | | 1/2018 | Handa ............... H01L 21/68707 |
| 2018/0374725 A1* | | 12/2018 | Holeyannavar ..... H01L 21/6719 |

FOREIGN PATENT DOCUMENTS

| | | | | | |
|---|---|---|---|---|---|
| CN | 102714170 | A | | 10/2012 | |
| JP | 2011091275 | A | | 5/2011 | |
| JP | 2012084802 | A | * | 4/2012 | ....... H01L 21/67265 |
| JP | 2012084802 | A | | 4/2012 | |
| JP | 2012129248 | A | | 7/2012 | |
| JP | 2016081968 | A | | 5/2016 | |
| KR | 100751495 | B1 | | 8/2007 | |
| KR | 101845797 | B1 | * | 4/2018 | |
| KR | 101845797 | B1 | | 4/2018 | |
| TW | 201834955 | A | | 10/2018 | |
| TW | 201841296 | A | | 11/2018 | |
| TW | 201908897 | A | | 3/2019 | |

OTHER PUBLICATIONS

PCT Notification Concerning Transmittal of International Preliminary Report on Patentability for PCT Application No. PCT/US2020/029252, dated Nov. 4, 2021, 9 pages.

Taiwan Office Action for Taiwan Patent Application No. 109113463, dated Jul. 18, 2022, 12 pages.

Chinese Office Action for CN Application No. 202080030122.9, dated Apr. 4, 2022, 5 pages.

Chinese Office Action for CN Application No. 202080030122.9, dated Sep. 20, 2022, 4 pages.

Japanese Office Action for Japanese Patent Application No. 2021-562090, dated Dec. 20, 2022, 11 pages.

* cited by examiner

EQUIPMENT FRONT END MODULES INCLUDING MULTIPLE ALIGNERS, ASSEMBLIES, AND METHODS

RELATED APPLICATIONS

The present application is a continuation application that claims the benefit under 35 U.S.C. § 120 of U.S. patent application Ser. No. 16/849,969, filed on Apr. 15, 2020, which claims the benefit under 35 U.S.C. § 119(e) of U.S. Provisional Application No. 62/837,271, filed Apr. 23, 2019. Both applications are incorporated herein by reference in their entirety for all purposes.

FIELD

Embodiments of the present disclosure relate to equipment front end modules (EFEMs), electronic device processing assemblies, and methods for operating equipment front end modules.

BACKGROUND

Processing of substrates in semiconductor device manufacturing is carried out in multiple process tools where the substrates travel between the process tools in substrate carriers such as Front Opening Unified Pods (FOUPs). The substrate carriers may be docked to a front wall of an equipment front end module (EFEM) that includes a load/unload robot. The load/unload robot is operable to transfer substrates between the substrate carriers and one or more destinations (e.g., load locks or process chambers) coupled to a rear wall of the EFEM opposite the front wall. However, in some instances, existing EFEMs have certain substrate throughput limitations.

SUMMARY

In some embodiments, equipment front end modules are provided. An equipment front end module includes: an equipment front end module body forming an equipment front end module chamber, the equipment front end module body including a plurality of walls; one or more load locks or process chambers coupled to one or more first walls; one or more load ports provided in one or more second walls, each of the one or more load ports configured to dock a substrate carrier; a plurality of alignment pedestals housed within the equipment front end module chamber; and a load/unload robot at least partially housed within the equipment front end module chamber, the load/unload robot including a plurality of blades.

In some embodiments, electronic device processing assemblies are provided. The electronic device processing assembly includes: an equipment front end module body forming an equipment front end module chamber; one or more load locks coupled to a one or more first walls of the equipment front end module body, the one or more load locks configured to exchange substrates into and out of a transfer chamber or a process chamber; one or more load ports provided in one or more second walls of the equipment front end module body, each of the one or more load ports configured to dock a substrate carrier; a plurality of alignment pedestals housed within the equipment front end module chamber; and a load/unload robot at least partially housed within the equipment front end module chamber, the load/unload robot including a plurality of blades configured to simultaneously transfer multiple substrates between the one or more load ports and the plurality of alignment pedestals.

In some embodiments, a method of operating an equipment front end module is provided. A method includes moving blades of a load/unload robot to a vertically aligned position to access vertically-stacked substrate storage devices; and moving the blades of the load/unload robot to a vertically misaligned position to access a plurality of alignment pedestals simultaneously.

Numerous other aspects and features are provided in accordance with these and other embodiments of the disclosure. Other features and aspects of embodiments of the disclosure will become more fully apparent from the following detailed description, the claims, and the accompanying drawings.

BRIEF DESCRIPTION OF DRAWINGS

The drawings, described below, are for illustrative purposes and are not necessarily drawn to scale. The drawings are not intended to limit the scope of the disclosure in any way. Wherever possible, the same or like reference numbers will be used throughout the drawings to refer to the same or like parts.

DETAILED DESCRIPTION

Reference will now be made in detail to the example embodiments provided, which are illustrated in the accompanying drawings. Features of the various embodiments described herein may be combined with each other unless specifically noted otherwise.

In the processing of substrates in electronic device manufacturing, an equipment front end module (EFEM) receives substrates from one or more substrate carriers. The substrate carriers may be docked to load ports located on a front wall thereof (e.g., docked to a load port configured on a front surface of an EFEM body). The EFEM may include an EFEM chamber at least partially formed by the EFEM body.

In order to properly position a substrate prior to transferring the substrate to a processing chamber for processing, prior art EFEMs may include an alignment pedestal that rotates the substrate to a proper rotational orientation prior to processing. In some embodiments, the EFEMs may also include a side storage pod used to store substrates. For example, the side storage pod may store substrates returning from processing in the processing chamber(s). In some embodiments, the substrates may undergo degassing and/or cooling in the side storage pod. A load/unload robot may be located in an EFEM chamber and can deliver the substrates to the alignment pedestal and/or to one or more load locks or process chambers coupled on a wall of the EFEM (e.g., a rear wall thereof). However, such prior art EFEMs may suffer from low throughput. Thus, in accordance with embodiments described herein, enhanced throughput EFEMs are provided.

In one or more embodiments described herein, EFEMs including improved throughput include an EFEM body forming an EFEM chamber, wherein the EFEM body may include a front wall, a rear wall, and a side wall. A plurality of alignment pedestals and a load/unload robot including multiple blades may be housed within the EFEM chamber. Substrates may be transferred simultaneously from a load port and placed simultaneously onto the plurality of alignment pedestals. After the alignment pedestals align the substrates, the substrates may be simultaneously transferred from the plurality of alignment pedestals to one or more load locks or process chambers. Thus, throughput through the EFEM is improved. In some embodiments, the plurality of alignment pedestals can be vertically offset from one another, horizontally offset from one another, or the alignment pedestals can include a combination of vertical and horizontal offsets.

Further details of various embodiments of EFEMs, EFEMs including a plurality of alignment pedestals and a load/unload robot with multiple blades, electronic device processing assemblies, and methods of operating EFEMs providing improved (increased) substrate throughput are further described with reference to FIGS. 1A-7 herein.

Figure 1A:
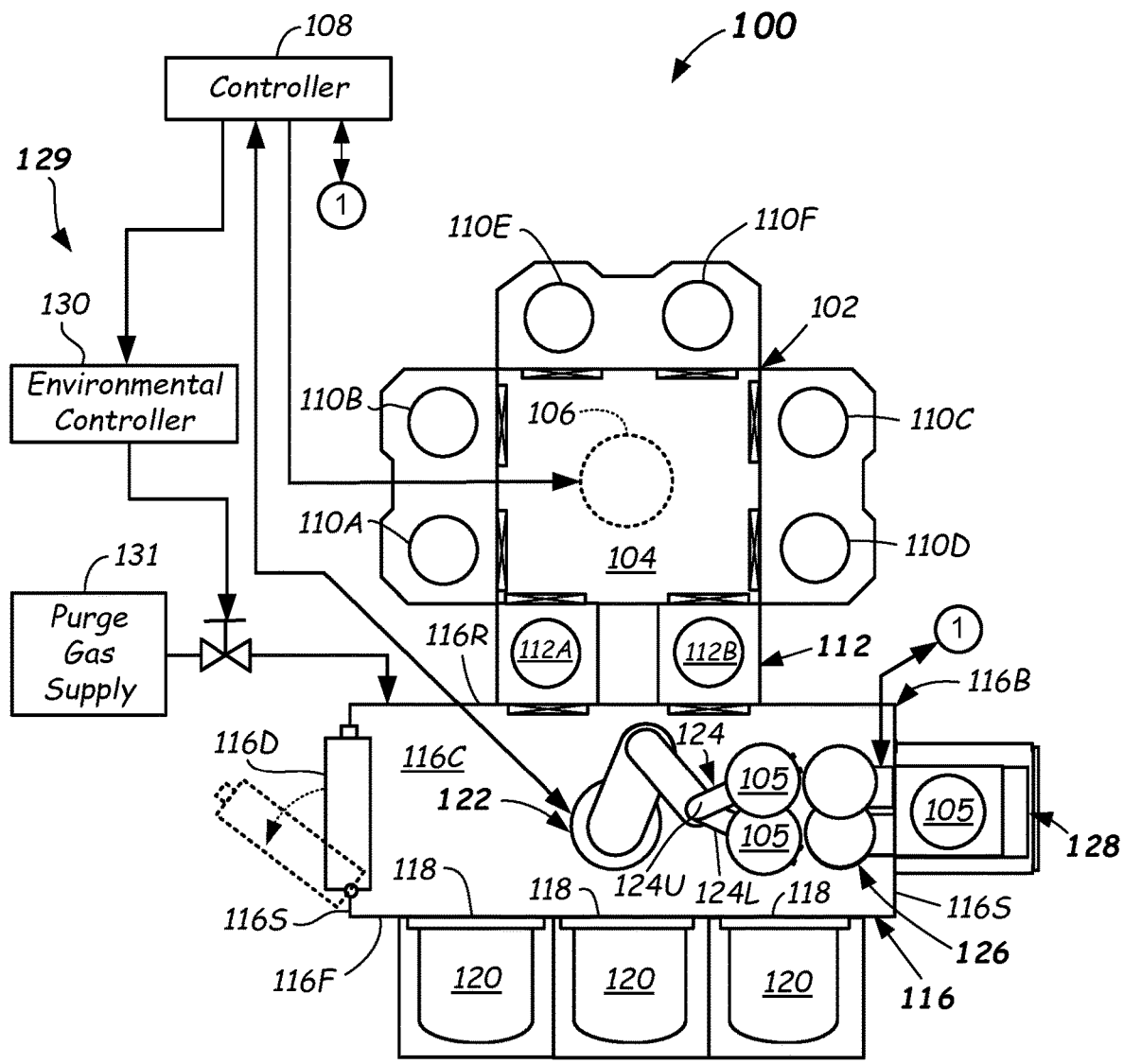
FIG. 1A illustrates a schematic top view of an electronic device processing assembly including an equipment front end module (EFEM) with a plurality of alignment pedestals and a load/unload robot including dual end effectors according to one or more embodiments of the disclosure.

FIG. 1A illustrates a schematic top view of an electronic device processing assembly 100 including an EFEM 116 including a plurality of alignment pedestals 126 according to one or more embodiments of the disclosure. The electronic device processing assembly 100 may include a mainframe 102 including mainframe walls defining a transfer chamber 104. A transfer robot 106 (shown as a dotted circle) may be at least partially housed within the transfer chamber 104.

The transfer robot 106 may be configured to place and extract substrates 105 to and from various destinations via operation of robot arms (not shown) of the transfer robot 106. Substrates 105, as used herein, includes articles used to make electronic devices or circuit components, such as semiconductor wafers, silicon-containing wafers, patterned or unpatterned wafers, glass plates, masks, and the like.

The motion of the various robot arm components of the transfer robot 106 can be controlled by suitable commands to a drive assembly (not shown) containing a plurality of drive motors commanded from a controller 108. Signals from the controller 108 may cause motion of the various robot arms of the transfer robot 106. Suitable feedback mechanisms may be provided for one or more of the robot arms by various sensors, such as position encoders, and the like. Controller 108 can include a suitable processor (e.g., microprocessor(s)), memory, drive units, and sensors that enable communication and control of the transfer robot 106 and a load/unload robot 122. Controller 108 may further control operations of other system components to be described more fully herein, such as load lock apparatus 112, process chambers 110A-110F, process chambers 110A', 110B' (FIG. 1B), slit valve doors (not shown), door openers (not shown), substrate carrier docking apparatus (not shown), and a plurality of alignment pedestals 126. The controller 108 may control other components.

The transfer robot 106 may include interconnected robot arms rotatable about a shoulder axis, which may be approximately centrally located in the transfer chamber 104, for example. Transfer robot 106 may include a base (not shown) that is configured to be attached to a chamber wall (e.g., a chamber floor) forming a lower portion of the transfer chamber 104. However, the transfer robot 106 may be attached to a ceiling in some embodiments (e.g., a chamber ceiling). The transfer robot 106 may be a dual-type robot configured to service twin chambers (e.g., side-by-side process chambers, as shown) when the transfer chamber 104 includes twinned-process chambers (as shown). Other types of process chamber orientations such as radially-oriented process chambers, as well as other types of transfer robots, such as selective compliance articulating robot arm (SCARA) robots, may be used.

The destinations for the transfer robot 106 may be one or more process chambers, such as a first process chamber set 110A, 110B, coupled to a first facet that may be configured and operable to carry out a process on the substrates 105 delivered thereto. Further destinations for the transfer robot 106 may also be a second process chamber set 110C, 110D coupled to a second facet opposite the first process chamber set 110A, 110B. Likewise, the destinations for the transfer robot 106 may also be a third process chamber set 110E, 110F coupled to a third facet that may be opposite a load lock apparatus 112.

The load lock apparatus 112 may include one or more load lock chambers (e.g., load lock chambers 112A, 112B, for example) coupled to a fourth facet. Load lock chambers 112A and 112B that are included in the load lock apparatus 112 may be single wafer load locks (SWLL) chambers, multi-wafer chambers, batch load lock chambers, or combinations thereof. For example, certain load locks, such as load lock chamber 112A, may be used for flow of substrates 105 into the transfer chamber 104, while other load lock chambers, such as load lock chamber 112B, may be used for moving substrates 105 out of the transfer chamber 104.

The process chambers 110A-110F can be configured and operable to carry out any suitable processing of the substrates 105, such as plasma vapor deposition (PVD) or chemical vapor deposition (CVD), etch, annealing, pre-clean, pre-heating, degassing, metal or metal oxide removal, or the like. Other deposition, removal, or cleaning processes may be carried out on substrates 105 contained therein.

Substrates 105 may be received into the transfer chamber 104 from the EFEM 116 and may also exit the transfer chamber 104 to the EFEM 116, through the load lock apparatus 112 that is coupled to one or more first walls (e.g., a rear wall 116R) of the EFEM 116. With additional reference to FIG. 1C, the EFEM 116 may be any enclosure having an EFEM body 116B including chamber walls, such as a front wall 116F, a rear wall 116R, side walls 116S, an upper wall 116CL (e.g., a ceiling), and a floor wall 116FL (e.g., a floor), for example, forming an EFEM chamber 116C. One of the side walls 116S may include an access door 116D that can be opened to gain access to the EFEM chamber 116C. One or more load ports 118 may be provided on one or more second walls (e.g., the front wall 116F) of the EFEM body 116B and may be configured to receive one or more substrate carriers 120 (e.g., FOUPs) thereat. Three substrate carriers 120 are shown, but more or fewer numbers of substrate carriers 120 may be docked to the EFEM 116. The load lock apparatus 112, the substrate carriers 120, and other devices that may stack substrates 105 in a vertical orientation may be collectively referred to as vertically-stacked substrate storage devices.

The EFEM 116 may include a suitable load/unload robot 122 within the EFEM chamber 116C thereof. The load/unload robot 122 may include a plurality of blades 124 (e.g., dual blades) and can be configured and operational, once a door of a substrate carrier 120 is opened, such as by a door opener mechanism (not shown), to extract multiple substrates 105 from the substrate carrier 120 simultaneously. Once extracted, the blades 124 may move the substrates 105 throughout the EFEM chamber 116C, and eventually into one or more of the load lock chambers 112A, 112B of the load lock apparatus 112. The load/unload robot 122 can be further configured to extract multiple substrates 105 from a substrate carrier 120 at a load port 118 and transfer the multiple substrates 105 simultaneously through the EFEM chamber 116C to a plurality of alignment pedestals 126. The blades 124 can be comprised of an upper blade 124U and a lower blade 124L. The upper blade 124U and lower blade 124L can be configured to a have a vertical offset 124O (FIG. 1C) relative to one another. Moreover, the upper blade 124U and the lower blade 124L may be configured to be independently rotatable and/or moveable relative to one another.

The alignment pedestals 126 may include devices that orient the substrates 105 to a predetermined direction. For example, the alignment pedestals 126 may optically scan the substrates 105 and identify notches (not shown) located on the substrates 105. The alignment pedestals 126 may then align the substrates 105 by rotating the substrates 105 until the notches are oriented to predetermined directions. Examples of alignment procedures and alignment pedestals are described in U.S. Pat. Nos. 3,972,424; 5,102,280; and 6,275,742.

Figure 1B:
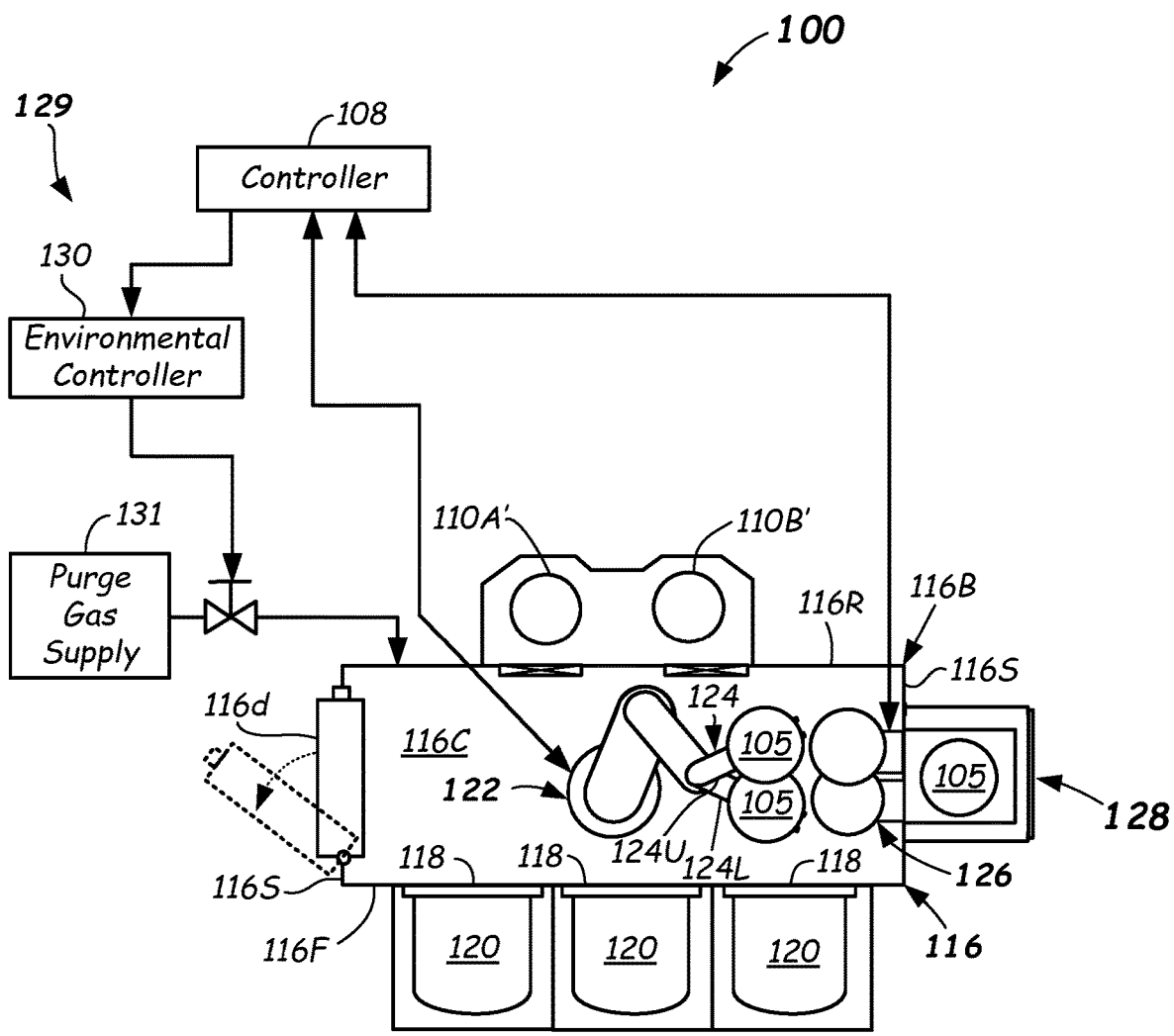
FIG. 1B illustrates a schematic top view of another embodiment of an electronic device processing assembly including an EFEM with a plurality of alignment pedestals and a load/unload robot including dual end effectors according to one or more embodiments of the disclosure.

After alignment at the plurality of alignment pedestals 126, the substrates 105 may be simultaneously transferred into one or more of the load lock chambers 112A, 112B of the load lock apparatus 112. The substrates 105 may then undergo subsequent processing in one or more of the process chambers 110A-110F. In the embodiment illustrated in FIG. 1B, process chambers 110A' and 110B' are located on the rear wall 116R of the EFEM 116. In the embodiment of FIG. 1B, after the substrates 105 are aligned at the plurality of alignment pedestals 126, the substrates 105 may be simultaneously transferred into one or more of the process chambers 110A', 110B'. For example, the blades 124 of the load/unload robot 122 may simultaneously transfer multiple substrates 105 to or from the process chambers 110A', 110B'.

The plurality of alignment pedestals 126 may be coupled to one or more walls of the EFEM 116, including the side walls 116S, the front wall 116F, and/or the rear wall 116R. Alternatively, the plurality of alignment pedestals 126 may be coupled to a floor wall 116FL (FIG. 1C) of the EFEM 116. The plurality of alignment pedestals 126 may be mounted in any suitable manner to be accessible to the blades 124 of the load/unload robot 122.

The load/unload robot 122 may be configured and operational to extract substrates 105 from the load lock apparatus 112 (or process chambers 110A', 110B' in FIG. 1B) and simultaneously transfer the substrates 105 into a side storage pod apparatus 128. For example, the transfers may occur after processing of the substrates 105 in one or more of the process chambers 110A-110F (or process chambers 110A', 110B'). In some embodiments, the load/unload robot 122 may be configured and operational to extract multiple substrates 105 from the substrate carriers 120 and simultaneously transfer the substrates 105 into the side storage pod apparatus 128 prior to processing.

The EFEM chamber 116C may be provided with an environmental control system 129 including an environmental controller 130 and a purge gas supply 131 configured to provide an environmentally-controlled atmosphere to the EFEM chamber 116C. In particular, the environmental controller 130 may be operational to monitor and/or control environmental conditions within the EFEM chamber 116C. Monitoring may be by way of one or more sensors. In some embodiments, and at certain times, the EFEM chamber 116C may receive a non-reactive gas therein, such as during processing of the substrates 105. The non-reactive gas can be an inert gas such as Argon (Ar), Nitrogen ($N_2$), and/or helium (He) and may be provided from the purge gas supply 131. Other gases may be used. The environmental controller 130 may interface with the controller 108 to synchronize operations within the EFEM 116.

Figure 1C:
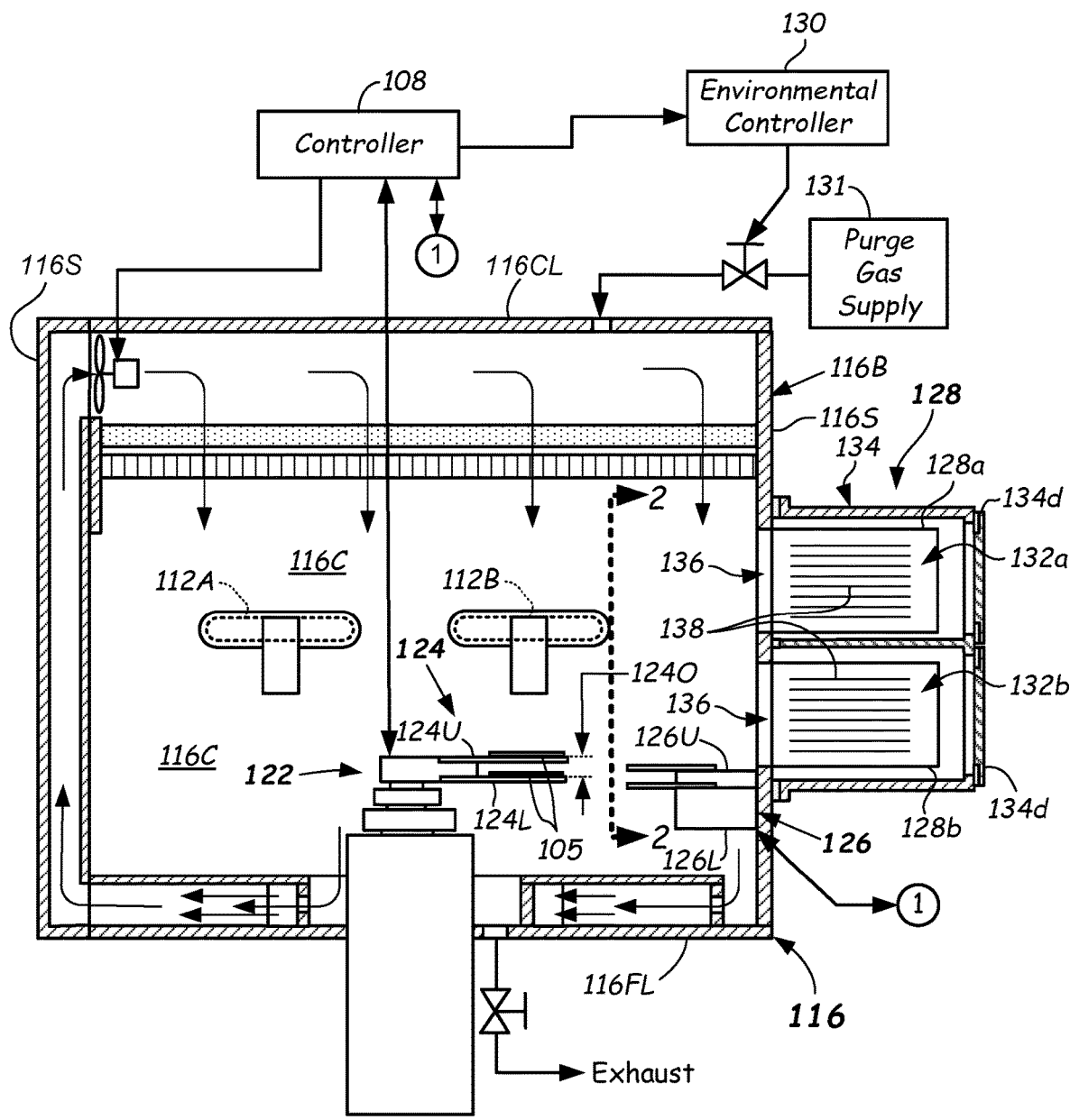
FIG. 1C illustrates a cross-sectioned side view of an EFEM including a plurality of alignment pedestals and a load/unload robot including dual end effectors according to one or more embodiments of the disclosure.

In the depicted embodiment of FIG. 1C, the side storage pod apparatus 128 may contain one or more side storage containers 128a, 128b. Each of the side storage containers 128a, 128b may define respective side storage pod chambers 132a, 132b therein that are configured to provide for storage of the substrates 105. The two side storage containers 128a, 128b are shown arranged one above the other. However, other suitable orientations are possible, such as side-by-side, space allowing. Moreover, more or less than two of the side storage containers 128a, 128b may be provided in the side storage pod apparatus 128.

The side storage pod apparatus 128 may be enclosed entirely within a retaining enclosure 134, which may also be coupled and sealed to a side wall 116S of the EFEM 116 by any suitable means, such as a gasket, O-ring, or other seals and suitable coupling devices. The side storage containers 128a, 128b may be loaded into and removed from the retaining enclosure 134 through access doors 134d. The access doors 134d allows for easy maintenance and cleaning of the side storage pod chambers 132a, 132b. The access doors 134d also allows for the ability to quickly add new or cleaned side storage containers 128a, 128b therein.

The access doors 134d and the retaining enclosure 134 may be configured to provide a sealed environment surrounding the side storage containers 128a, 128b. In some embodiments, the side storage containers 128a, 128b can be in fixed locations on the side wall 116S of the EFEM 116.

Substrates 105 may be transferred to and from the side storage pod chambers 132a, 132b through pod openings 136 in the side storage pod apparatus 128. The pod openings 136 may couple to like openings formed in a side wall 116S of the EFEM 116. The pod openings 136 can remain open at all times, thus allowing unfettered access to substrates 105 stored therein by the blades 124 of the load/unload robot 122. Thus, multiple substrates 105 can be simultaneously inserted into or simultaneously retracted from a side storage pod chamber 132a or 132b of the side storage pod apparatus 128.

Figure 2:
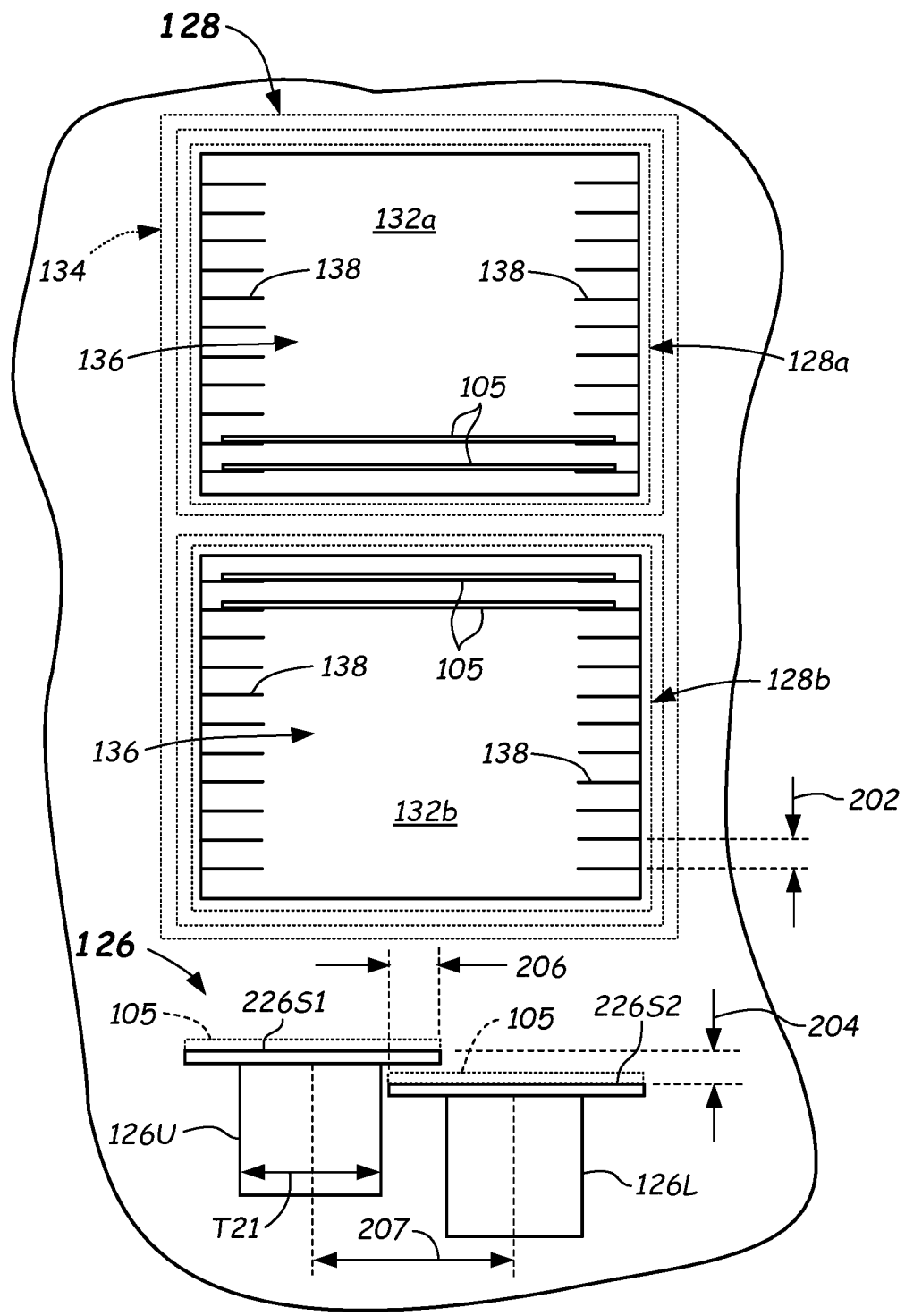
FIG. 2 illustrates a partial, schematic, front view taken along view line 2-2 in FIG. 1C of an EFEM including a plurality of alignment pedestals and a side storage pod apparatus according to one or more embodiments of the disclosure.

Additional reference is made to FIG. 2, which illustrates a partial schematic front cross-sectional view taken along section line 2-2 in FIG. 1C of the EFEM 116. The view of FIG. 2 includes the plurality of alignment pedestals 126 and the side storage pod apparatus 128 according to one or more embodiments of the disclosure. Storage locations within the side storage containers 128a, 128b may be formed from a plurality of pod support members 138 that may be vertically-spaced at defined increments, such as every 10 mm, for example. The plurality of pod support members 138 may be spaced apart from each other by a pod vertical spacing 202. The pod vertical spacing 202 may be a sufficient distance to allow the upper blade 124U and the lower blade 124L of the load/unload robot 122 to load and unload multiple substrates 105 (e.g., two substrates 105) simultaneously from the pod support members 138.

The plurality of pod support members 138 are configured to support substrates 105 horizontally thereon at the pod vertical spacing 202. For example, the pod support members 138 may comprise suitable support shelves extending laterally towards each other from each side of the side storage containers 128a and 128b. The pod support members 138 may be configured to support a portion of each substrate 105, such as the edges thereof. The pod support members 138 may be short enough so that they do not interfere with the blades 124 of the load/unload robot 122.

In the depicted embodiment of FIG. 2, the plurality of pod support members 138 within the side storage containers 128a and 128b are configured to provide for the pod vertical spacing 202 between supported substrates 105 that can range from 7 mm to 35 mm, or even 7 mm to 40 mm, in some embodiments, for example. In some embodiments, the pod vertical spacing 202 may be about 10 mm. In other embodiments, the pod vertical spacing 202 may be greater than 40 mm. Other ranges may be used. A similar storage shelf configuration with a carrier vertical spacing the same as the pod vertical spacing 202 may be implemented in the substrate carriers 120 (FIGS. 1A and 1B). Likewise, a spacing configuration of multiple supports with a load lock vertical spacing the same as the pod vertical spacing 202 may be implemented in the load lock chambers 112a and 112b (FIGS. 1A and 1B).

The plurality of alignment pedestals 126 may be arranged side-by-side within the EFEM chamber 116C. Two alignment pedestals 126 are shown herein, but more than two alignment pedestals 126 may be provided, such as three, four, or more. The number of blades 124 of the load/unload robot 122 may be equal to the number of alignment pedestals 126. In the depicted embodiment, an upper alignment pedestal 126U and a lower alignment pedestal 126L are provided side-by-side, but with a vertical offset relative to one another. The plurality of alignment pedestals 126 are shown coupled to the side wall 116S at a level lower than the pod openings 136 of the side storage pod apparatus 128. However, other suitable coupling orientations are possible, space allowing, as discussed above.

The upper alignment pedestal 126U and the lower alignment pedestal 126L can be arranged to provide for a vertical offset 204 between the respective support surfaces 226S1 and 226S2 and between substrates 105 (shown dotted in FIG. 2) positioned on each of the support surfaces 226S1, 226S2. Some embodiments of the alignment pedestals 126 may not include support surfaces 226S1, 226S2. Rather, the alignment pedestals 126 may include devices that support substrates 105 on planes defined by the support surfaces 226S1, 226S2. The vertical offset 204 can range from 7 mm to 35 mm, or even 7 mm to 40 mm, in some embodiments, for example. In some embodiments, the vertical offset 204 may be about 10 mm. In other embodiments, the vertical offset 204 may be greater than 40 mm. Other vertical offset ranges may be used.

The pod vertical spacing 202 between the plurality of pod support members 138 within the side storage containers 128a, 128b and the vertical offset 204 between each of the support surfaces 226S1, 226S2 of the plurality of alignment pedestals 126 can be equal to or greater than the vertical offset 1240 (FIG. 1C) between the upper blade 124U and the lower blade 124L of the load/unload robot 122. The pod vertical spacing 202 and the vertical offset 204 may be equal to the vertical offset 1240 between each of the blades 124 of the load/unload robot 122 if more than two blades are used in the load/unload robot 122. Moreover, the vertical offset 204 between each of the support surfaces 226S1, 226S2 of the plurality of alignment pedestals 126 may be greater than the pod vertical spacing 202 between the plurality of pod support members 138 within the side storage containers 128a and 128b. In some embodiments, the minimum vertical offset 204 is the vertical offset 1240 between the multiple blades 124 of the load/unload robot 122.

In the depicted embodiment of FIG. 2, the plurality of alignment pedestals 126 are arranged side-by-side, along the side wall 116S of the EFEM 116 such that the substrates 105, when nominally positioned on the upper alignment pedestal 126U and the lower alignment pedestal 126L, partially overlap one another. Substrates 105 on the upper alignment pedestal 126U and the lower alignment pedestal 126L can overlap sufficiently to provide for an overlap 206 of substrates 105 supported on each of the plurality of the support surfaces 226S1, 226S2 of the alignment pedestals 126. In some embodiments, the overlap 206 of substrates 105 supported on each of the plurality of support surfaces 226S1, 226S2 can range from 120 mm to 300 mm. In some embodiments, the overlap 206 can be as large as necessary as long as the thickness T21 of the upper alignment pedestal 126U is of sufficient thickness to support a substrate and/or the support surface 226S1. In some embodiments, the thickness T21 is about 80 mm. In other embodiments, the thickness T21 may be as low as about 5 mm.

Figure 3A:
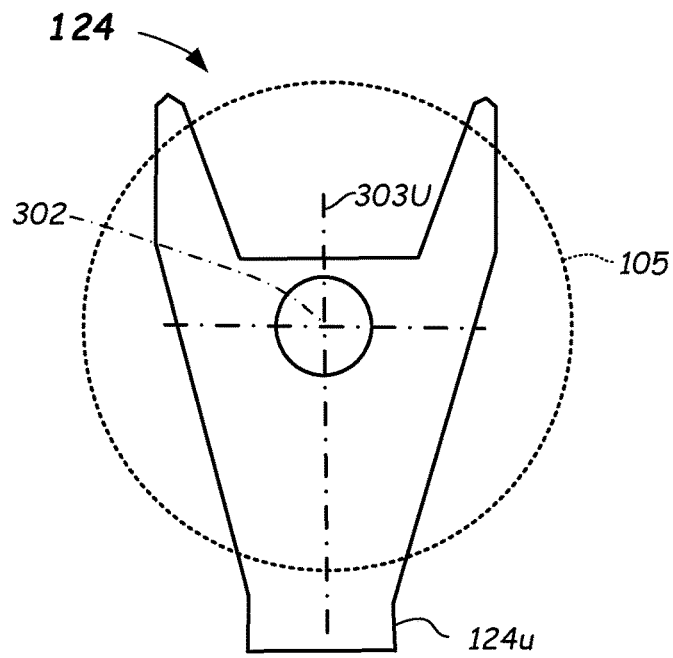
FIG. 3A illustrates a schematic top view of multiple blades (e.g., dual blades) of a load/unload robot that are shown vertically aligned according to one or more embodiments of the disclosure.
Figure 3B:
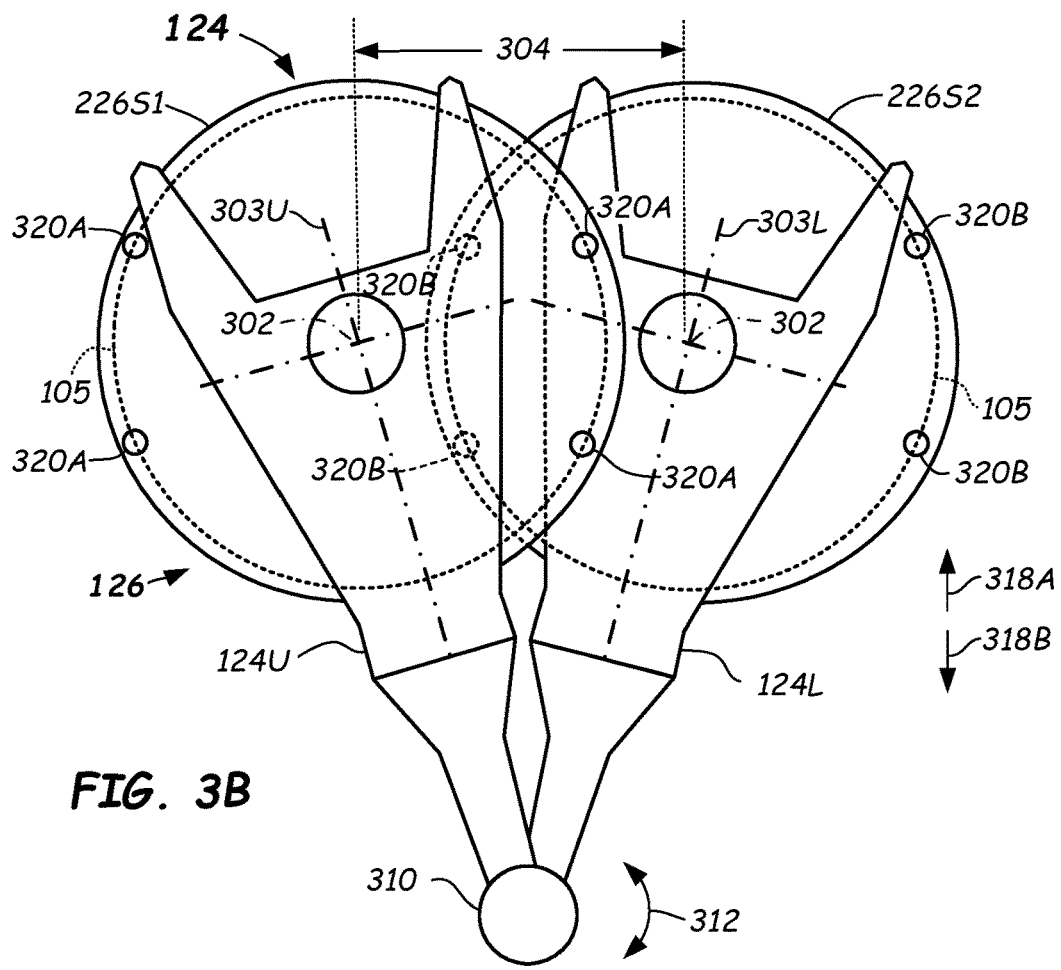
FIG. 3B illustrates a schematic top view of multiple blades (e.g., dual blades) of a load/unload robot that are shown vertically misaligned according to one or more embodiments of the disclosure.

Reference is made to FIGS. 3A and 3B, which illustrate top plan views of the blades 124 of the load/unload robot 122 (FIG. 1B) in aligned and misaligned states, respectively. In the aligned state, the blades 124 may be vertically aligned as shown in FIG. 3A. The aligned state enables the blades 124 to access substrates 105 located in vertically aligned storage areas, such as in the side storage pod apparatus 128. In the misaligned state, the blades 124 may access substrates 105 that are vertically offset, such as substrates located on the alignment pedestals 126 illustrated in FIGS. 1A-2.

The range of the overlap 206 between each of substrates 105 positioned on the plurality of alignment pedestals 126 may be within a range of a vertical misalignment between the upper blade 124U and the lower blade 124L of the load/unload robot 122 relative to one another. This vertical misalignment between the upper blade 124U and the lower blade 124L allows for the simultaneous placement and removal of substrates 105 from each of the plurality of alignment pedestals 126. The overlap 206 also allows for the width of the EFEM 116 to be made smaller, while accommodating simultaneous placement of multiple substrates 105 on the alignment pedestals 126. In order to accomplish simultaneous placement of substrates 105 onto the plurality of alignment pedestals 126 with the upper blade 124U and the lower blade 124L, the upper blade 124U and the lower blade 124L can each be rotated apart via the operation of independent rotational movement of the blades 124. In order to avoid supports and the like on the alignment pedestals 126, the upper blade 124U and the lower blade 124L may be moved together and/or apart as the blades 124 access the alignment pedestals 126 or other components.

FIG. 3A illustrates a top view of two blades 124 in the vertically aligned state. The blades 124 may be vertically aligned when the blades 124 access substrates 105 (FIGS. 1A-1C) located in the substrate carriers 120, side storage pod apparatus 128, and load lock apparatus 112 according to one or more embodiments of the disclosure. In the vertically aligned configuration, the upper blade 124U is vertically aligned with the lower blade 124L (not viewable in FIG. 3A). For example, the upper blade 124U and the lower blade 124L may be rotated towards each other such that any offset between the centers 302 of the blades 124 is minimized. In some embodiments, the vertical alignment provides for centerlines 303U, 303L of the blades 124 to be aligned.

FIG. 3B illustrates a top view of two blades 124 vertically misaligned to access the plurality of alignment pedestals 126 according to one or more embodiments of the disclosure. FIG. 3B illustrates a wrist joint 310 that may couple to the blades 124 to enable the blades 124 to rotate about an arc 312. In this misaligned configuration, the upper blade 124U and the lower blade 124L can be vertically misaligned (e.g., vertically offset) relative to one another while accessing each of the plurality of alignment pedestals 126 (FIG. 2). Specifically, from the vertically aligned orientation previous discussed, the upper blade 124U may be rotated in a first direction, and the lower blade 124L may be rotated in a second direction opposite the first direction via the wrist joint 310. The rotation of each of the blades 124 provides for an offset 304 between the centers 302 of the blades 124 and/or the substrates 105 supported on each of the blades 124. The vertical misalignment may also be described as the centerlines 303U, 303L of the blades 124 being at an angle relative to one another.

The resulting offset 304 between the centers 302 of the blades 124 and/or the substrates 105 supported on each of the blades 124 may substantially match a horizontal spacing 207 (FIG. 2) between centers of each of the plurality of support surfaces 226S1, 226S2 of the alignment pedestals 126. This configuration allows for the simultaneous transfer of multiple substrates 105 (two as shown) to and from the plurality of alignment pedestals 126. Specifically, the simultaneous transfer of substrates 105 can be to or from the upper alignment pedestal 126U using the upper blade 124U and to or from the lower alignment pedestal 126L using the lower blade 124L. As shown in FIG. 2, the substrates 105 on the support surfaces 226S1, 226S2 may overlap by the overlap 206.

The blades 124 may move in a direction 318A to access the support surfaces 226S1, 226S2 of the alignment pedestals 126. For example, the multiple blades 124 may move in the direction 318A to set substrates 105 onto the support surfaces 226S1, 226S2 or to retrieve aligned substrates 105 from the support surfaces 226S1, 226S2. The blades 124 may move in a direction 318B when moving away from the support surfaces 226S1, 226S2. In some embodiments, the support surface 226S1 may include a plurality of lift points 320A and the support surface 226S2 may include a plurality of lift points 320B. As shown in FIG. 3B if the blades 124 are in the vertically misaligned position and move in either the direction 318A or the direction 318B while proximate the support surfaces 226S1, 226S2, the blades 124 may contact the lift points 320A, 320B. In some embodiments, the blades 124 transition between the vertically aligned and the vertically misaligned positions as the blades 124 move proximate the support surfaces 226S1, 226S2 in order to avoid the lift points 320A, 320B. For example, the blades 124 may rotate about the wrist joint 310 along the arc 312 as the blades 124 move proximate the alignment pedestals 126. The path taken by the blades 124 proximate the alignment pedestals 126 may depend on the locations of the lift points 320A, 320B and other obstacles.

Figure 4:
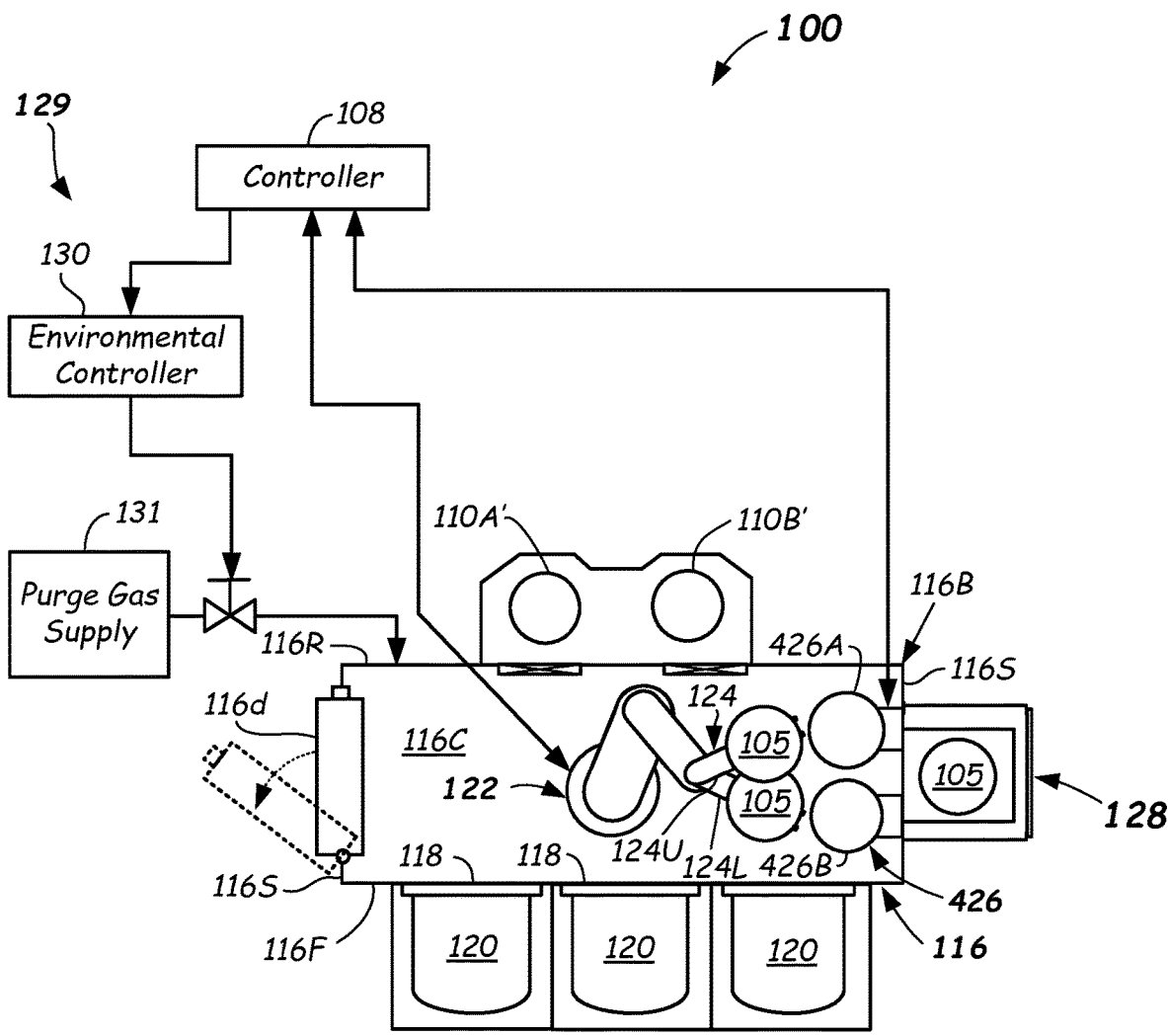
FIG. 4 illustrates a schematic top view of an EFEM including two alignment pedestals located side-by-side and in a non-overlapping configuration according to one or more embodiments of the disclosure.

Reference is made to FIG. 4, which illustrates an embodiment of the EFEM 116 that includes two alignment pedestals 426 located side-by-side. In the embodiment of FIG. 4, the EFEM 116 includes two alignment pedestals 426, which are referred to individually as a first alignment pedestal 426A and a second alignment pedestal 426B. In other embodiments, the EFEM 116 may include more than two alignment pedestals 426. The alignment pedestals 426 may not provide for any vertical overlap of substrates 105 located on the alignment pedestals 426. The lack of vertical overlap of the substrates 105 may provide for independent lifting of the substrates 105. For example, the substrate 105 located on the second support surface 426S2 will not contact the substrate 105 located on the first support surface 426S1 during vertical lifting.

Figure 5:
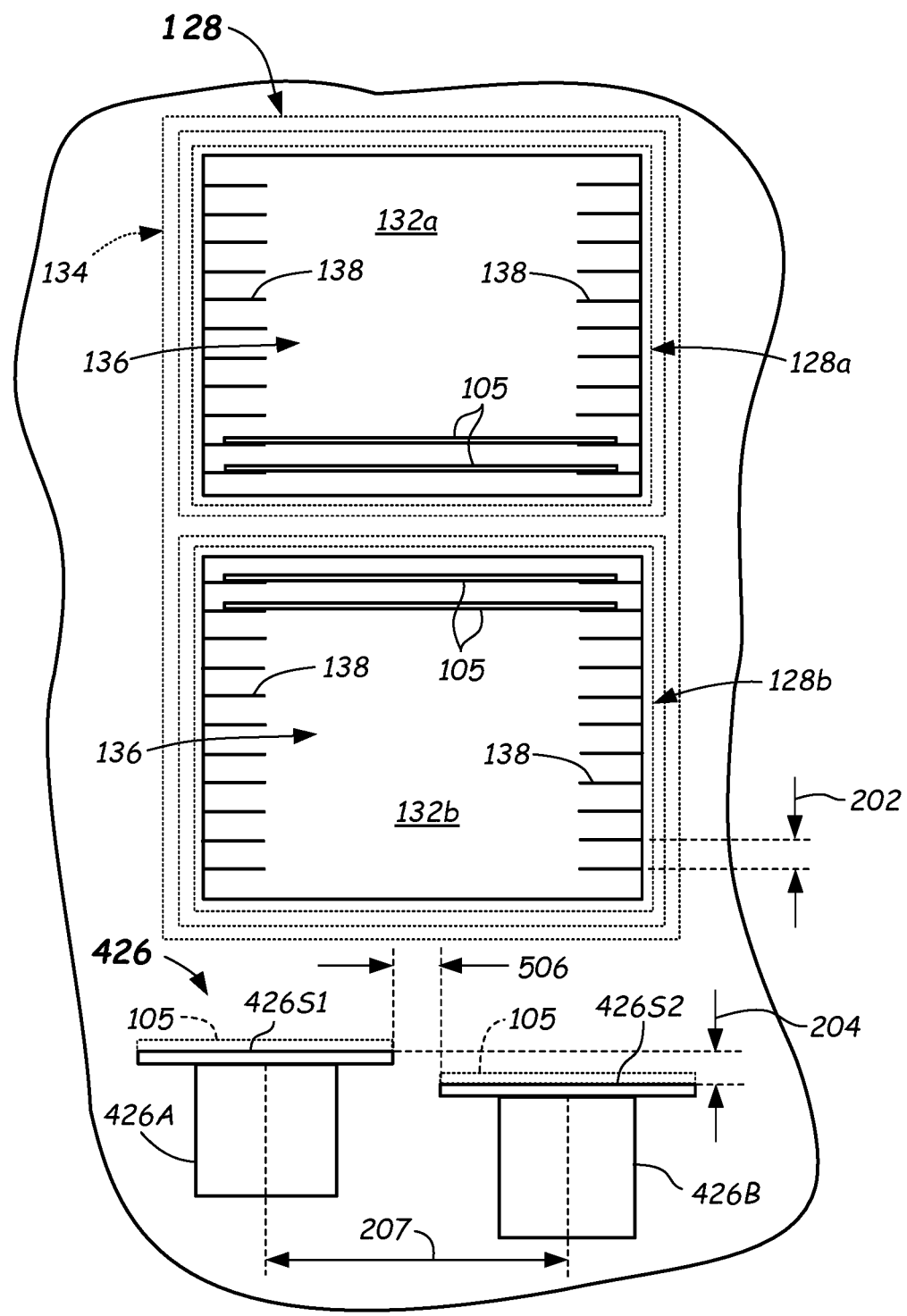
FIG. 5 illustrates a partial, schematic, front, cross-sectioned view of an interior of an EFEM including two alignment pedestals located in a non-overlapping side-by-side orientation according to one or more embodiments of the disclosure.

Additional reference is made to FIG. 5, which illustrates a view of the EFEM 116 similar to the view of FIG. 2, but with no overlap between the alignment pedestals 426 or substrates 105 located thereon. As shown in FIG. 5, a horizontal space 506 exists between edges of substrates 105 located on a first support surface 426S1 of the first alignment pedestal 426A and a second support surface 426S2 of the second alignment pedestal 426B. A similar horizontal space may exist between edges of the first support surface 426S1 and the second support surface 426S2. In some embodiments, the alignment pedestals 426 may use devices (not shown) other than the first support surface 426S1 and the second support surface 426S2 to support the substrates 105. These devices may be separated by a horizontal space, which may be similar to the horizontal space 506.

In the embodiment shown in FIG. 5, the first support surface 426S1 and the second support surface 426S2 are vertically offset by the vertical offset 204. In some embodiments, the first support surface 426S1 and the second support surface 426S2 are not vertically offset and are on the same plane. Accordingly, the substrates 105 supported by the first support surface 426S1 and the second support surface 426S2 may be located on the same plane.

Figure 6:
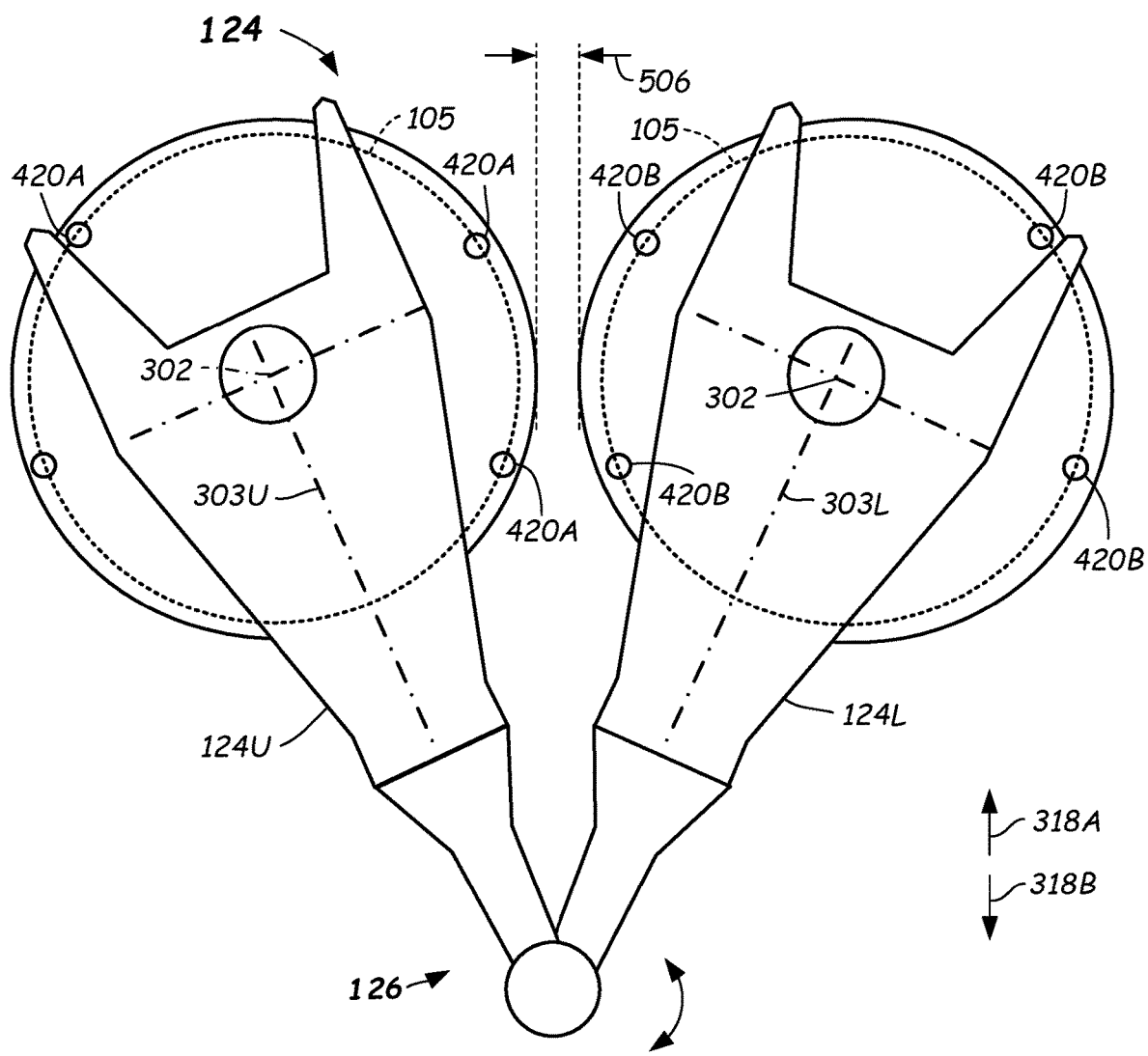
FIG. 6 illustrates a schematic top view of multiple blades (e.g., dual blades) of a load/unload robot that are vertically misaligned according to one or more embodiments of the disclosure.

With additional reference to FIG. 6, the blades 124 may extend to a misaligned position wherein there is no overlap between substrates 105 when accessing the alignment pedestals 426. For example, edges of the substrates 105 may be separated by the horizontal space 506. The blades 124 may rotate by the wrist joint 126 as the blades 124 move relative to the alignment pedestals 426 (FIG. 4) to avoid lift points 420A, 420B and/or other obstacles.

Figure 7:
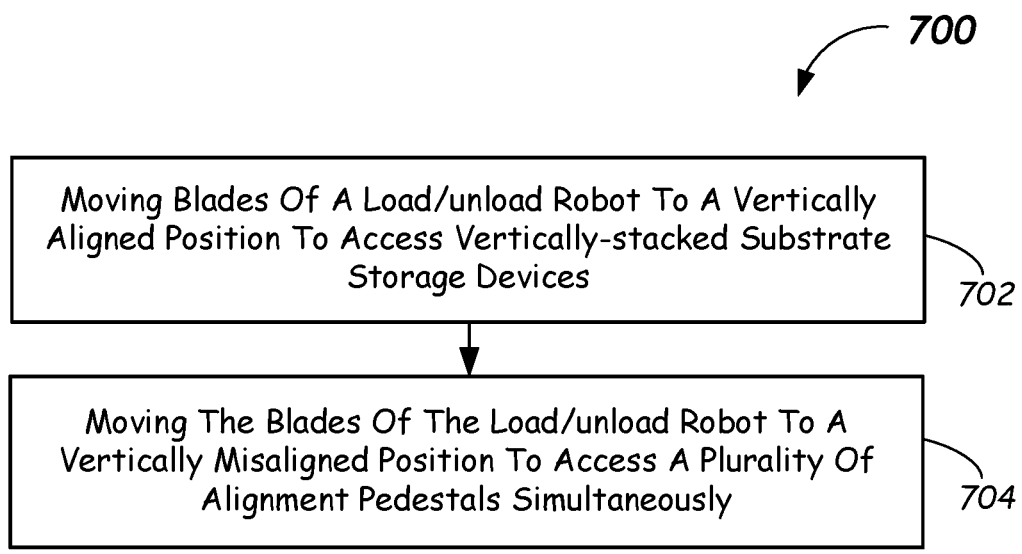
FIG. 7 illustrates a flowchart depicting a method of operating an EFEM including a plurality of alignment pedestals according to one or more embodiments of the disclosure.

FIG. 7 illustrates a flowchart 700 depicting a method of operating an equipment front end module (e.g., EFEM 116).

The method may include, at 702, moving blades (e.g., blades 124) of a load/unload robot (e.g., load/unload robot 122) to a vertically aligned position to access vertically-stacked substrate storage devices (e.g., load lock apparatus 112). The method may include, at 704, moving the blades of the load/unload robot to a vertically misaligned position to access a plurality of alignment pedestals (e.g., alignment pedestals 126) simultaneously.

It should be readily appreciated that the present disclosure is susceptible of broad utility and application. Many embodiments and adaptations of the present disclosure other than those herein described, as well as many variations, modifications, and equivalent arrangements, will be apparent from, or reasonably suggested by, the present disclosure and the foregoing description thereof, without departing from the substance or scope of the present disclosure. Accordingly, while the present disclosure has been described herein in detail in relation to specific embodiments, it is to be understood that this disclosure is for illustrative purposes and presents examples of the present disclosure and is made merely for purposes of providing a full and enabling disclosure. This disclosure is not intended to be limited to the particular apparatus, assemblies, systems and/or methods disclosed, but, to the contrary, the intention is to cover all modifications, equivalents, and alternatives falling within the scope of the claims.

What is claimed is:

1. A system comprising:
   an equipment front end module chamber;
   a plurality of alignment pedestals housed within the equipment front end module chamber, wherein the plurality of alignment pedestals comprises a first alignment pedestal having a first support surface and a second alignment pedestal having a second support surface, and wherein the first support surface has a vertical offset and an overlap region relative to the second support surface, the overlap region having at least a partial overlap and a horizontal spacing relative to the second support surface; and
   a load/unload robot at least partially housed within the equipment front end module chamber, the load/unload robot including an arm, and a plurality of vertically arranged blades attached to the arm, wherein the plurality of vertically arranged blades comprises an upper blade configured to transfer a first substrate to the first alignment pedestal and a lower blade configured to transfer a second substrate to the second alignment pedestal.

2. The system of claim 1, further comprising a side storage pod apparatus coupled to the equipment front end module chamber, wherein the side storage pod apparatus comprises a pod opening positioned at a location higher than the plurality of alignment pedestals.

3. The system of claim 2, wherein the side storage pod apparatus further comprises a plurality of pod support members vertically spaced from each other by a spacing that is substantially equal to a distance of the vertical offset.

4. The system of claim 1, wherein the vertical offset ranges from 7 mm to 40 mm.

5. The system of claim 1, wherein the overlap region ranges from 120 mm to 300 mm.

6. The system of claim 1, further comprising a load lock apparatus coupled to the equipment front end module chamber.

7. The system of claim 6, wherein the load/unload robot is configured and operable to:
   simultaneously extract the plurality of substrates in a vertically aligned state;
   simultaneously transfer each of the plurality of substrates to one of the plurality of alignment pedestals in a vertically misaligned state; and
   simultaneously transfer an aligned substrate from each of the plurality of alignment pedestals into the load lock apparatus.

8. The system of claim 7, wherein load/unload robot is configured to provide a vertical misalignment of the plurality of blades relative to one another while accessing the plurality of alignment pedestals, and wherein the vertical misalignment between the plurality of blades is proportional to a spacing between the plurality of alignment pedestals.

9. The system of claim 1, further comprising a plurality of load ports coupled to the equipment front end module chamber.

10. The system of claim 9, wherein each load port of the plurality of load ports is configured to dock a substrate carrier comprising a plurality of support members.

11. The system of claim 10, wherein the plurality of support members comprises a first support member and a second support member that are vertically spaced from each other by a distance that is substantially equal to a distance that at least two of the first and second alignment pedestals are vertically offset relative to each other.

12. The system of claim 9, wherein the load/unload robot is configured to provide a vertical alignment of the plurality of vertically arranged blades relative to one another while accessing the plurality of load ports.

13. A system comprising:
   an equipment front end module chamber;
   a load lock apparatus coupled to the equipment front end module chamber;
   a plurality of load ports coupled to the equipment front end module chamber, wherein each load port of the plurality of load ports is configured to dock a substrate carrier comprising a plurality of support members;
   a plurality of alignment pedestals housed within the equipment front end module chamber, wherein the plurality of alignment pedestals comprises a first alignment pedestal having a first support surface and a second alignment pedestal having a second support surface, and wherein the first support surface has a vertical offset and an overlap region relative to the second support surface, the overlap region having at least a partial overlap and a horizontal spacing relative to the second support surface; and
   a load/unload robot at least partially housed within the equipment front end module chamber, the load/unload robot including an arm, and a plurality of vertically arranged blades attached to the arm, wherein the plurality of vertically arranged blades comprises an upper blade configured to transfer a first substrate to the first alignment pedestal and a lower blade configured to transfer a second substrate to the second alignment pedestal.

14. The system of claim 13, further comprising:
   a side storage pod apparatus coupled to the chamber;
   wherein the side storage pod apparatus comprises a pod opening positioned at a location higher than the plurality of alignment pedestals, and a plurality of pod support members vertically spaced from each other by a spacing that is substantially equal to a distance of the vertical offset.

15. The system of claim 13, wherein the vertical offset ranges from 7 mm to 40 mm, and wherein the overlap region ranges from 120 mm to 300 mm.

16. The system of claim 13, wherein the load/unload robot is configured and operable to:
    simultaneously extract the plurality of substrates in a vertically aligned state;
    simultaneously transfer each of the plurality of substrates to one of the plurality of alignment pedestals in a vertically misaligned state; and
    simultaneously transfer an aligned substrate from each of the plurality of alignment pedestals into the load lock apparatus.

17. The system of claim 16, wherein load/unload robot is configured to provide a vertical misalignment of the plurality of blades relative to one another while accessing the plurality of alignment pedestals, and wherein the vertical misalignment between the plurality of blades is proportional to a spacing between the plurality of alignment pedestals.

18. The system of claim 16, wherein the plurality of support members comprises a first support member and a second support member that are vertically spaced from each other by a distance that is substantially equal to a distance that at least two of the first and second alignment pedestals are vertically offset relative to each other.

19. The system of claim 13, wherein the load/unload robot is configured to provide a vertical alignment of the plurality of vertically arranged blades relative to one another while accessing the plurality of load ports.

20. A method comprising:
    simultaneously extracting a plurality of substrates by moving a plurality of vertically arranged blades of a load/unload robot to a vertically aligned position to access vertically-stacked substrate storage devices, wherein the plurality of vertically arranged blades is attached to a single arm; and
    simultaneously transferring each substrate of the plurality of substrates to a corresponding alignment pedestal of a plurality of alignment pedestals by moving the plurality of vertically arranged blades to a vertically misaligned position to access the plurality of alignment pedestals simultaneously, wherein the plurality of alignment pedestals comprises an upper alignment pedestal having a first support surface and a lower alignment pedestal having a second support surface having a vertical offset and an overlap region relative to the first support surface, the overlap region having at least a partial overlap and a horizontal spacing relative to the first support surface.

* * * * *